United States Patent [19]
Roderick

[11] Patent Number: 6,043,607
[45] Date of Patent: Mar. 28, 2000

[54] APPARATUS FOR EXCITING A PLASMA IN A SEMICONDUCTOR WAFER PROCESSING SYSTEM USING A COMPLEX RF WAVEFORM

[75] Inventor: Craig A. Roderick, San Jose, Calif.

[73] Assignee: Applied Materials, Inc., Santa Clara, Calif.

[21] Appl. No.: 08/991,749

[22] Filed: Dec. 16, 1997

[51] Int. Cl.[7] .................................................. H05H 1/46
[52] U.S. Cl. ............................... 315/111.21; 315/111.51; 118/723 R
[58] Field of Search .......................... 315/111.21, 111.41, 315/111.51; 156/345 C; 118/723 R, 723 AN, 723 I, 723 IR

[56] References Cited

U.S. PATENT DOCUMENTS

| | | | |
|---|---|---|---|
| 4,859,908 | 8/1989 | Yoshida et al. | 315/111.81 |
| 5,444,259 | 8/1995 | Ohmi | 315/111.81 X |
| 5,494,522 | 2/1996 | Moriya et al. | 118/723 R X |
| 5,607,542 | 3/1997 | Wu et al. | 156/643.1 |
| 5,705,931 | 1/1998 | Klick | 315/111.21 X |
| 5,712,592 | 1/1998 | Stimson et al. | 315/111.21 X |
| 5,841,237 | 11/1998 | Alton | 315/111.21 X |
| 5,859,501 | 1/1999 | Chi | 315/111.21 |
| 5,876,663 | 3/1999 | Laroussi | 315/111.21 X |
| 5,882,414 | 3/1999 | Fong et al. | 118/723 R |

FOREIGN PATENT DOCUMENTS

| | | |
|---|---|---|
| 0 552 491 A1 | 7/1993 | European Pat. Off. . |
| 0 742 577 A2 | 11/1996 | European Pat. Off. . |
| 0 776 991 A1 | 6/1997 | European Pat. Off. . |
| WO 95/32315 | 11/1995 | WIPO . |

*Primary Examiner*—Robert Pascal
*Assistant Examiner*—Justin P. Bettendorf
*Attorney, Agent, or Firm*—Thomason, Moser & Patterson

[57] ABSTRACT

A method and apparatus for generating a complex waveform and coupling the waveform to a reaction chamber of a semiconductor wafer processing system using a power amplifier. Specifically, the apparatus includes a complex waveform generator coupled to a high-power amplifier. The high-power amplifier is coupled to one or more frequency selective matching networks which select bands of RF signal to be coupled to plasma excitation circuit within the semiconductor wafer processing system.

29 Claims, 3 Drawing Sheets

APPARATUS FOR EXCITING A PLASMA IN A SEMICONDUCTOR WAFER PROCESSING SYSTEM USING A COMPLEX RF WAVEFORM

BACKGROUND OF THE DISCLOSURE

1. Field of the Invention

The present invention relates to semiconductor wafer processing equipment and, more particularly, to a method and apparatus for exciting a plasma within a semiconductor wafer processing system using a complex radio-frequency (RF) waveform as a plasma excitation waveform.

2. Description of the Background Art

Traditionally, plasma-enhanced reactive ion semiconductor wafer processing systems contain an anode and cathode within a vacuum chamber. The cathode typically forms a pedestal for supporting a semiconductor wafer within the chamber and the anode is formed of the walls and/or top of the chamber. To process a wafer, a reactive gas is pumped into the vacuum chamber and the anode and cathode are driven by a single sinusoidal frequency RF source to excite the reactive gas into a plasma. The single frequency is typically 13.56 MHz, although frequencies from 100 kHz to 2.45 GHz are often used, with the occasional use of other frequencies. More specifically, a single frequency, sinusoidal RF signal is generally applied to the reactive gas within the chamber at a relatively high-power level, e.g., 3 kilowatts. The RF power excites the reactive gas, producing a plasma within the chamber proximate to the semiconductor wafer being processed. Such plasma-enhanced reactive ion processing has been used in etch and chemical vapor deposition processes.

More recently, multiple sinusoidal frequencies have been used to excite a plasma within a vacuum chamber. In such systems, a cathode/anode bias circuit is driven with a first RF frequency and an antenna or coil, proximate the vacuum chamber, is driven with a second RF frequency. Thus, each circuit is coupled to a separate and distinct RF power delivery system consisting of separate RF oscillators, preamplifiers, power amplifiers, transmission lines, and matching networks that supply independent sinusoidal RF frequencies at high power levels to each of the plasma excitation circuits. Such redundancy of oscillators and other circuitry is costly and complex.

Therefore, there is a need in the art for a method and apparatus for generating complex waveforms for plasma excitation within a process chamber, where the waveforms have multiple frequency components that are both harmonically and non-harmonically related.

SUMMARY OF THE INVENTION

The disadvantages heretofore associated with the prior art are overcome by the present invention of a method and apparatus for generating a complex waveform and coupling the waveform to a reaction chamber of a semiconductor wafer processing system. The apparatus couples the waveform to the chamber using either a single, power amplifier capable of amplifying multiple frequencies or a channelized amplifier that separately amplifies channels containing different frequency bands.

Specifically, a first embodiment of the present invention includes a complex waveform generator coupled to a high-power amplifier. The high-power amplifier drives an RF splitter that couples power to one or more frequency selective matching networks. The matching networks select particular bands of RF power to be coupled to plasma excitation circuitry within the reaction chamber.

The complex waveform generator produces waveforms of any form using a Fourier waveform analysis technique. Alternatively, the complex waveform generator may be a digital waveform generator which produces digitally synthesized waveforms. Such complex waveform generators are widely available in the signal processing arts. Using such waveform generators facilitates optimal tailoring of the excitation waveform to the chamber environment and plasma load impedance.

In a second embodiment of the invention, a channelized amplifier is used rather than a single, power amplifier having a bandwidth sufficient to amplify all the frequencies in the complex waveform, e.g., a broadband power amplifier. The channelized amplifier amplifies distinct bands of frequencies generated by a complex waveform generator.

Furthermore, to augment either the first or second embodiments of the invention, a dynamic feedback device can be added to enable certain indicia of complex waveform content (e.g., the power in distinct frequency bands within the complex waveform) to be measured and used to control the complex waveform. For example, if the dynamic feedback device measures power within particular frequency bands contained in the complex waveform and manipulates the power in those frequency bands, the output power within the complex waveform is dynamically controlled to optimize power coupled to the plasma.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
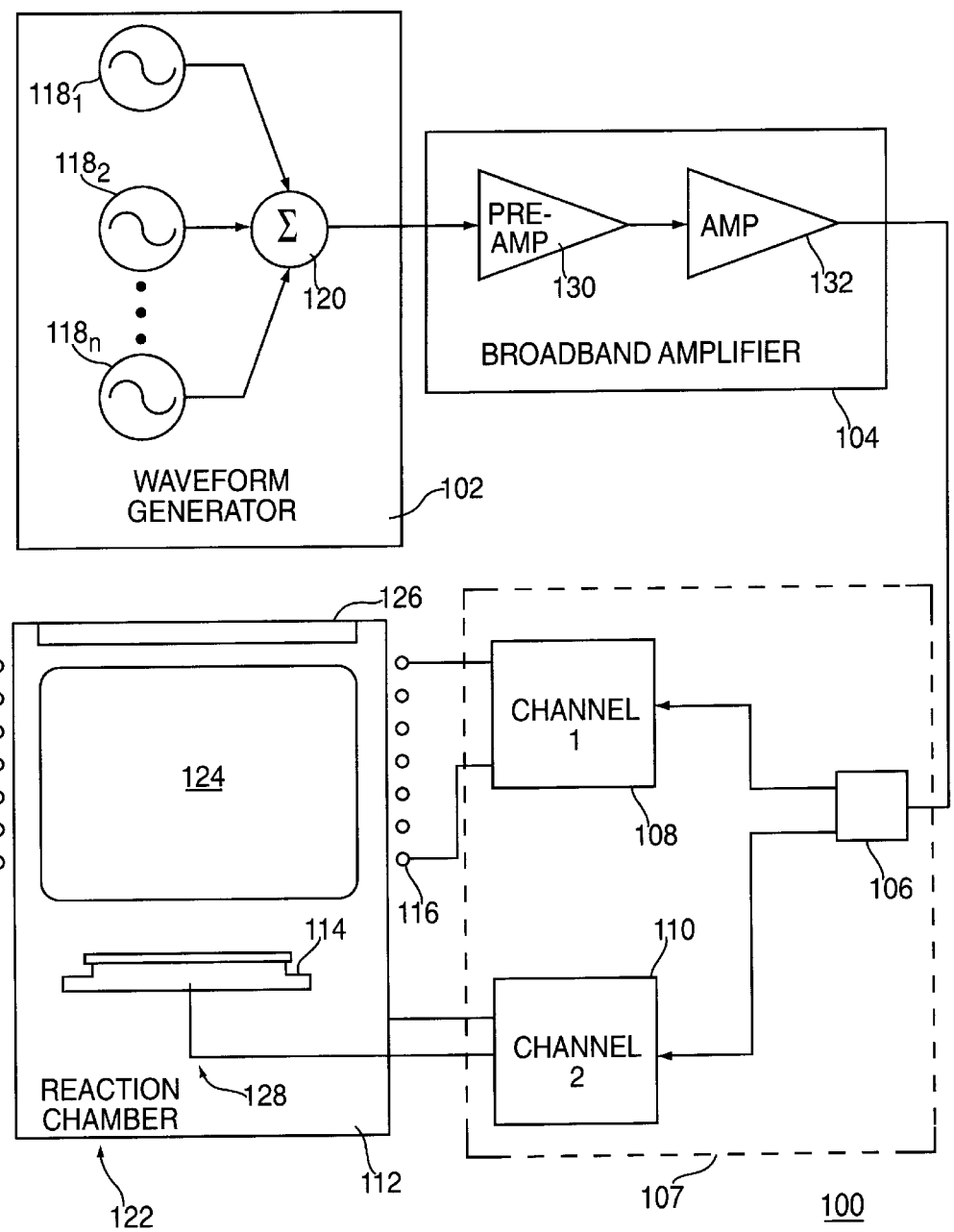
FIG. 1 depicts a block diagram of a first embodiment of the present invention.

FIG. 1 depicts a block diagram of a plasma excitation system 100 for generating a complex RF waveform and coupling the waveform to a reaction chamber 112 of a semiconductor wafer processing system 122 to excite a plasma 124 therein. The semiconductor wafer processing system 122 contains at least one plasma excitation circuit, e.g., an RF bias circuit 128. The plasma excitation circuit may also contain a second circuit, e.g., an antenna or coil 116 located proximate the chamber 112. The bias circuit 128 contains cathode 114, which also forms a wafer pedestal, and an anode 126, e.g., one or more of the chamber walls and/or the chamber top.

The system 100 further comprises a complex waveform generator 102 coupled to a power amplifier 104. The power amplifier 104 amplifies the complex waveform which is then coupled to a matching network 107. To amplify the complex waveform, which generally contains a broad frequency spectrum, the power amplifier is a broadband power amplifier. To facilitate coupling of the amplified waveform to the chamber, a power splitter 106 (or transformer) is used to couple the single amplifier output to two or more matching networks 108 and 110. The matching network passes certain wavelengths (frequency bands) of the complex waveform to the respective plasma excitation circuits 128 and 116. Specifically, the complex waveform(s) (e.g., selected frequency bands) are coupled to the cathode and anode electrodes 114 and 126 or, optionally, to an antenna 116 proximate the reaction chamber 112, or both.

In this first embodiment of the invention, the complex waveform generator 102 is a Fourier signal generator which generates any waveform, including pulses, multiple sinusoids, square waveshapes triangular waveshapes and the like, by combining a plurality of sinusoidal waveforms of particular frequencies and amplitudes using well-known Fourier transform techniques. In particular, the Fourier signal generator (waveform generator 102) contains a plurality of sinusoidal signal generators $118_n$ (n is an integer greater than 1) and a summer 120. Alternatively, the complex waveform is generated digitally using a digital waveform generator. Such waveform generators are well-known and commonly used in the signal processing arts. The particular waveform used is generally process specific.

The complex waveform is applied to the power amplifier 104. The amplifier has a bandwidth of at least one octave, and more typically, a decade bandwidth, e.g., 400 kHz to 4 MHz. Although, if the complex waveform is a narrowband signal, e.g., less than one octave, then a narrowband power amplifier will suffice. The amplifier 104 generates an output on the order of hundreds to a few kilowatts of output power. The amplifier 104 may contain a preamplifier 130 driving a power amplifier 132. A commercially available broadband power amplifier is available as model 2000L from Amplifier Research Corporation.

The amplified waveform from the power amplifier 104 is matched to the load impedance of the plasma excitation circuits 128/116 through a broadband matching network 107. The broadband matching network 107 may contain transmission line transformers which apply the broadband signals to the plasma excitation circuits. Alternatively, the RF power is channelized and coupled to the plasma excitation circuits using two or more frequency selective matching networks 108 and 110 arranged in a parallel circuit configuration. As such, the RF signal is divided amongst the matching networks using an RF power splitter 106. Each network optimally couples a particular band of frequencies to the impedance of a particular plasma excitation circuit, e.g., either the antenna 116 or a bias circuit 128. For example, one network applies a 100 Hz pulse waveform to the bias circuit 128 and another applies a 2 MHz sine wave to the antenna 116.

Power coupled to the reaction chamber in this manner facilitates flexible and adaptive techniques for exciting a plasma within the chamber. Furthermore, the complex waveform generator permits waveforms to be tuned to the process then being accomplished within the reaction chamber such that waveform optimization techniques may be used.

Figure 2:
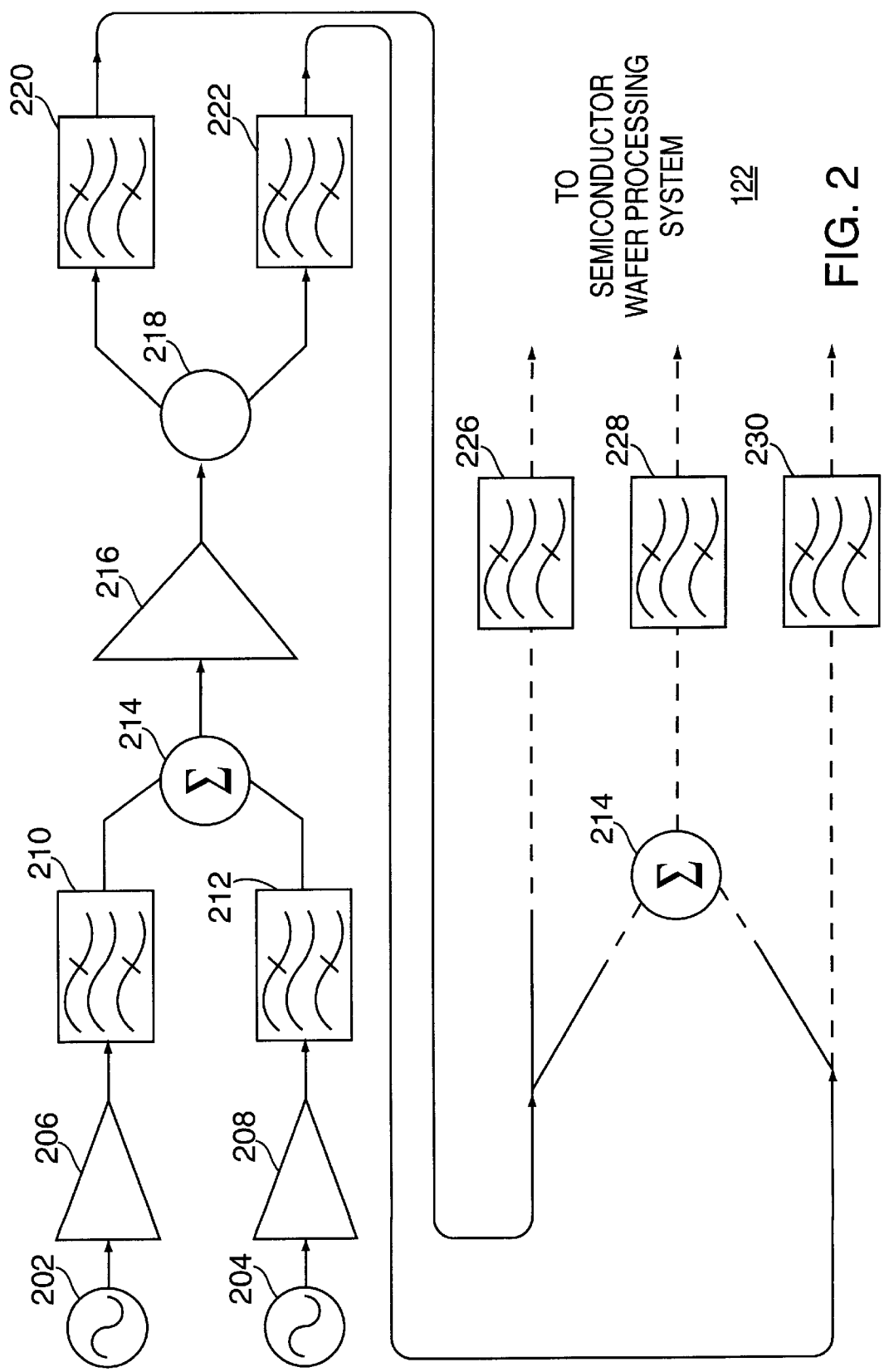
FIG. 2 depicts a block diagram of a second embodiment of the present invention.

FIG. 2 depicts a block diagram of a second embodiment of the present invention having a pair of channelized amplifiers 206 and 208 which preamplify the sinusoidal signals prior to applying the signal to a channelized power amplifier 216. A plurality of oscillators 202 and 204 each are coupled to a respective preamplifier 206 and 208. The output of each preamplifier 206 and 208 is coupled to a respective matching network 210 and 212 tuned to match the frequency of each oscillator 202 and 204 to a signal combiner 214. The combined oscillator signals from combiner 214 are coupled to channelized power amplifier 216 that is capable of amplifying multiple frequency bands simultaneously using, for example, a single amplifier tube. The output of the power amplifier 216 is coupled to a power splitter 218 which may be either a transformer or a "hardwire" splitter circuit. The multiple outputs from the splitter 218 are coupled to respective matching networks 220 and 222. The output of each of the matching networks 220 and 222 is coupled to a particular load, e.g., the plasma excitation circuits of a semiconductor wafer processing system 122. As shown by the dashed lines, the various frequencies from the various matching networks 220 and 222 may be combined using multiple filters 226, 228 and 230, diplexers (not shown) and/or combiners 224 to facilitate coupling multiple frequencies as complex waveforms to various components of the semiconductor wafer processing system 122.

Figure 3:
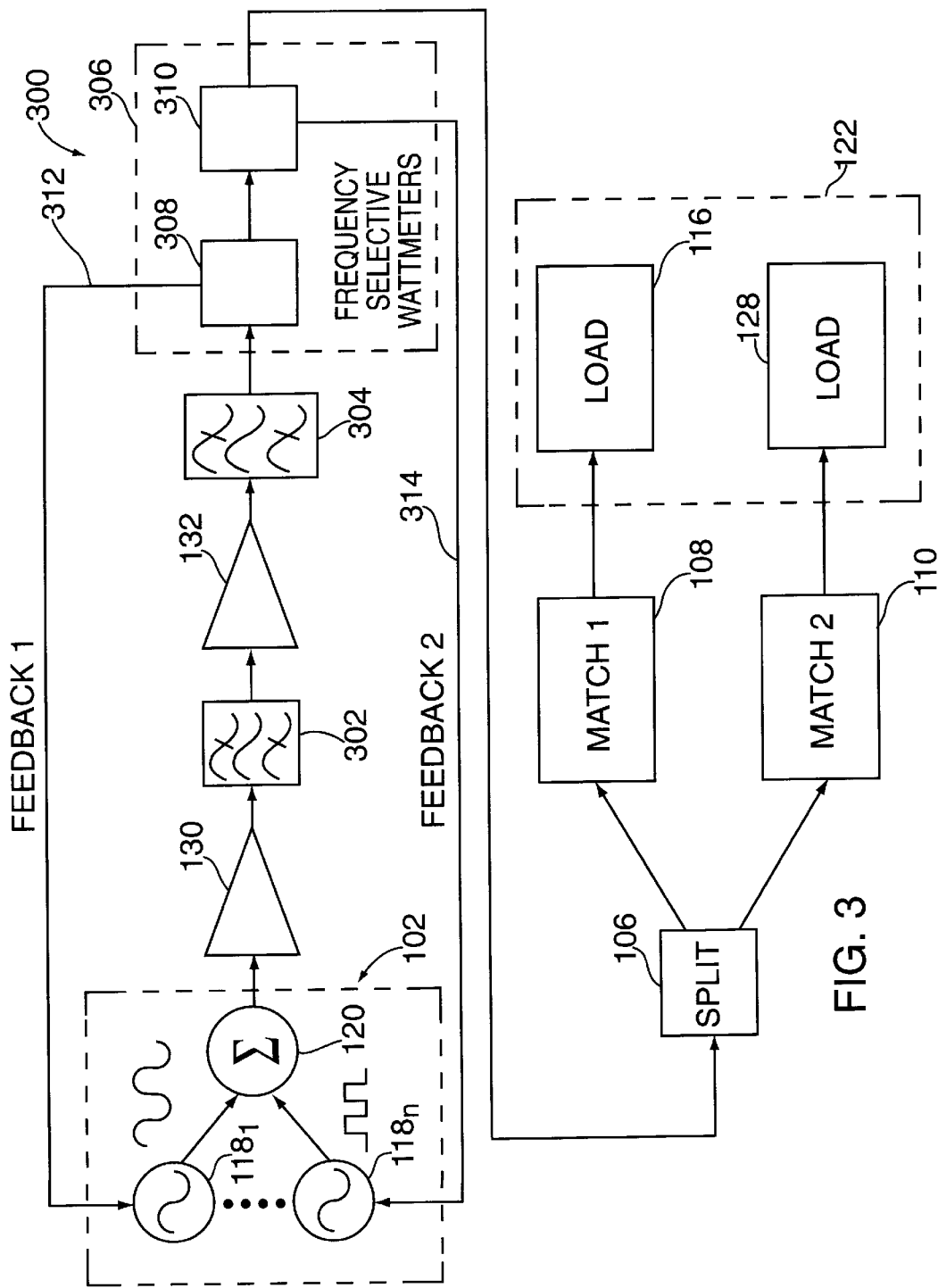
FIG. 3 depicts a block diagram of the first embodiment of the invention including a dynamic feedback apparatus.

FIG. 3 depicts a block diagram of the first embodiment of the invention including feedback control device 300 for dynamically controlling one or more signal characteristics (e.g., amplitude, power, frequency, and the like) of the signals produced by each of the oscillators 118, to $188_n$. The system comprises a waveform generator 102 which in its simplest form is a plurality of oscillators 188, to $118_n$ coupled to a signal summer 120. The summer 120 provides a composite signal (complex waveform) from the oscillators $118_n$ to preamplifier 130. The preamplifier is coupled to the power amplifier 132 through a matching network 302. Broadband power amplifier 132 is coupled to a matching network 304.

The amplified signals are coupled to the feedback control device 300. The device 300, in its broadest sense, measures one or more indicia of complex waveform content and controls the waveform generator to manipulate the content of the complex waveform. In the embodiment shown, the device 300 contains a plurality of frequency selective watt meters 308 and 310 that provide signals (e.g., a DC voltage) indicative of the magnitude of each of the oscillators' signals within the composite signal. The frequency selective watt meters can also provide an indication of the power within specific bands of frequencies. As such, the signal on line 312 (FEEDBACK 1) represents the power of oscillator 118, and the signal on path 314 (FEEDBACK 2) represents the power of oscillator $118_n$ within the composite signal. These feedback signals are applied to the respective oscillators 118, and $118_n$ to adjust the oscillator power levels to achieve a specific (desired) combination of power levels in the composite signal.

The composite signal is coupled from the apparatus 300 to splitter 106 such that the composite signal is evenly applied to matching networks 108 and 110 and ultimately to loads 116 and 128 within the semiconductor wafer processing system 122. As such, the power level of the signal components coupled to each load can be dynamically controlled to achieve optimal plasma excitation.

The feedback control device 300 (e.g., the pair of frequency selective watt meters and/or other circuit arrangements for measuring signal components and adjusting the oscillators in response thereto) may be applied to either the first or second embodiments of this invention. Furthermore, other feedback control devices can be used to provide dynamic control of the complex waveform. Such devices include a spectrum analyzer, a waveform analyzer, and the like that can be used to control the complex waveform based upon spectral content of the waveform or waveshape of the complex waveform. All such devices that provide dynamic feedback to the waveform generator are considered equivalent devices.

There has thus been shown and described a novel apparatus for exciting a plasma within a semiconductor wafer processing system using a complex RF waveform. Many changes, modifications, variations and other uses and applications of the subject invention will, however, become apparent to those skilled in the art after considering this specification and the accompanying drawings which disclose the embodiments thereof. All such changes, modifications, variations and other uses and applications which do not depart from the spirit and scope of the invention are deemed to be covered by the invention, which is to be limited only by the claims which follow.

What is claimed is:

1. Apparatus for exciting a plasma within a semiconductor wafer processing system, comprising:

a complex waveform generator for generating a complex waveform;

a power amplifier, coupled to said complex waveform generator, for amplifying said complex waveform; and a matching network, coupled to the power amplifier, for matching the impedance of the power amplifier to the impedance of plasma excitation circuitry within said semiconductor wafer processing system.

2. The apparatus of claim 1 wherein said complex waveform generator further comprises a plurality of sinusoidal frequency sources coupled to a summer for producing a complex waveform using a Fourier transform.

3. The apparatus of claim 1 wherein the complex waveform generator is a digital waveform generator.

4. The apparatus of claim 1 wherein the power amplifier has a bandwidth of at least a decade.

5. The apparatus of claim 1 wherein the matching network further comprises two or more frequency selective matching networks.

6. The apparatus of claim 1 wherein the matching network comprises a transmission line transformer.

7. The apparatus of claim 1 wherein the power amplifier is a channelized amplifier.

8. The apparatus of claim 1 wherein said plasma excitation circuitry further comprises a radiative coil positioned proximate a plasma reaction chamber.

9. The apparatus of claim 8 wherein said plasma excitation circuitry further comprises a cathode pedestal positioned within said plasma reaction chamber.

10. The apparatus of claim 8 wherein said control device further comprises a plurality of power measuring devices for generating said measured indicia of complex waveform content as power within selected frequency bands of the complex waveform.

11. The apparatus of claim 1 further comprising a control device, coupled to the power amplifier and said complex waveform generator, for dynamically controlling the complex waveform in response to measured indicia of complex waveform content.

12. The apparatus of claim 1 wherein said plasma excitation circuitry further comprises a cathode pedestal positioned within a plasma reaction chamber.

13. Apparatus for exciting a plasma within a semiconductor wafer processing system, comprising:

a complex waveform generator for generating a complex waveform;

a broadband power amplifier, coupled to said complex waveform generator, for amplifying said complex waveform;

a control device, coupled to the broadband power amplifier and said complex waveform generator, for dynamically controlling the complex waveform in response to measured indicia of complex waveform content; and a broadband matching network, coupled to the broadband amplifier, for matching the impedance of the broadband amplifier to the impedance of plasma excitation circuitry within said semiconductor wafer processing system.

14. The apparatus of claim 13 wherein said complex waveform generator further comprises a plurality of sinusoidal frequency sources coupled to a summer for producing a complex waveform using a Fourier transform.

15. The apparatus of claim 13 wherein the complex waveform generator is a digital waveform generator.

16. The apparatus of claim 13 wherein the power amplifier has a bandwidth of at least a decade.

17. The apparatus of claim 13 wherein the broadband matching network further comprises two or more frequency selective matching networks.

18. The apparatus of claim 13 wherein the broadband matching network comprises a transmission line transformer.

19. The apparatus of claim 13 wherein the broadband power amplifier is a channelized amplifier.

20. The apparatus of claim 13 wherein said plasma excitation circuitry further comprises a radiative coil positioned proximate a plasma reaction chamber.

21. The apparatus of claim 13 wherein said plasma excitation circuitry further comprises a cathode pedestal positioned within a plasma reaction chamber.

22. The apparatus of claim 21 wherein said plasma excitation circuitry further comprises a cathode pedestal positioned within said plasma reaction chamber.

23. A method of exciting a plasma within a semiconductor wafer processing system, comprising:

generating a complex waveform;

amplifying said complex waveform; and coupling the amplified complex waveform to plasma excitation circuitry within said semiconductor wafer processing system.

24. The method of claim 23 wherein said complex waveform is a summation of a plurality of sinusoidal frequencies.

25. The method of claim 23 wherein the complex waveform is a digital waveform.

26. The method of claim 23 wherein the coupling step further comprises using two or more frequency selective matching networks.

27. The method of claim 23 further comprising the steps of:

providing a channelized signal comprising at least a first signal and a second signal that form said complex waveform;

amplifying the channelized signal in a channelized amplifier;

dividing the amplified channelized signal to form an amplified first signal and an amplified second signal; and coupling the amplified first signal and the amplified second signal to said semiconductor wafer processing system.

28. The method of claim 23 further comprising the steps of:

measuring indicia of complex waveform content; and dynamically controlling the generation of the complex waveform in response to the measured indicia of complex waveform content.

29. The method of claim 28 wherein said measured indicia of complex waveform content is the power within selected frequency bands of the complex waveform.

* * * * *